United States Patent
Aso et al.

(10) Patent No.: US 10,485,087 B2
(45) Date of Patent: Nov. 19, 2019

(54) PORTABLE INFORMATION TERMINAL, BEAM IRRADIATION SYSTEM, AND PROGRAM

(71) Applicant: HITACHI HIGH-TECH SCIENCE CORPORATION, Minato-ku, Tokyo (JP)

(72) Inventors: Takuma Aso, Tokyo (JP); Atsushi Uemoto, Tokyo (JP); Tatsuya Asahata, Tokyo (JP); Masato Suzuki, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 15/936,183

(22) Filed: Mar. 26, 2018

(65) Prior Publication Data

US 2018/0288865 A1 Oct. 4, 2018

(30) Foreign Application Priority Data

Mar. 28, 2017 (JP) ................. 2017-062506

(51) Int. Cl.
*H05H 7/00* (2006.01)
*G21K 5/00* (2006.01)

(52) U.S. Cl.
CPC .............. *H05H 7/001* (2013.01); *G21K 5/00* (2013.01); *H05H 7/00* (2013.01); *H05H 2007/004* (2013.01); *H05H 2007/005* (2013.01); *H05H 2007/007* (2013.01)

(58) Field of Classification Search
CPC .... H05H 7/001; H05H 7/00; H05H 2007/004; H05H 2007/005; H05H 2007/007; G21K 5/00
USPC ............ 250/306, 307, 309, 310, 311, 492.1, 250/492.2, 492.3
See application file for complete search history.

(56) References Cited

U.S. PATENT DOCUMENTS

| | | | |
|---|---|---|---|
| 6,222,544 B1* | 4/2001 | Tarr | A61N 5/103 128/845 |
| 2009/0166557 A1* | 7/2009 | Makino | H01J 37/026 250/442.11 |
| 2018/0157500 A1* | 6/2018 | Watanabe | G01N 35/00871 |

FOREIGN PATENT DOCUMENTS

JP 2012-159699 8/2012

* cited by examiner

*Primary Examiner* — Nicole M Ippolito
(74) *Attorney, Agent, or Firm* — Adams & Wilks

(57) ABSTRACT

A portable information terminal is separated from a charged particle beam irradiation apparatus for performing processing of a sample by irradiating the sample with a charged particle beam. The portable information terminal performs operation of a first operation item at a desired position and includes a display controller causing a display unit to display an image containing a graphical user interface (GUI) capable of operating the first operation item based on operation by a user, the first operation item being one or more operation items among a plurality of items operable in the charged particle beam irradiation apparatus.

17 Claims, 7 Drawing Sheets

PORTABLE INFORMATION TERMINAL, BEAM IRRADIATION SYSTEM, AND PROGRAM

CROSS REFERENCE TO RELATED APPLICATION(S)

This application claims the benefit of Japanese Patent Application No. 2017-062506, filed Mar. 28, 2017, which is hereby incorporated by reference in its entirety into this application.

BACKGROUND OF THE INVENTION

1. Technical Field

The present invention relates generally to a portable information terminal, a beam irradiation system, and a program.

2. Description of the Related Art

Research or development of a technology on a charged particle beam irradiation apparatus that performs processing of a sample by irradiating the sample with a charged particle beam has been conducted.

In this regard, a charged particle beam irradiation apparatus controlled by a control device having a touch panel is well known (referring to Patent Document 1).

DOCUMENT OF RELATED ART (Patent Document 1) Japanese Patent Application Publication No. 2012-159699

SUMMARY OF THE INVENTION

Here, in the conventional charged particle beam irradiation apparatus, multiple operation items operable in the charged particle beam irradiation apparatus are operated by either an operation panel or a control device of the charged particle beam irradiation apparatus. The operation panel is a panel in which hardware, such as, a dial, a button, etc. for operating each of the multiple operation items is provided. However, the operation panel cannot be detached from the control device to carry. Also, mostly, the control device is integrated with the charged particle beam irradiation apparatus. Also, even though the control device is separated from the charged particle beam irradiation apparatus, it may not be possible to control the charged particle beam irradiation apparatus due to device failure caused by being carried, etc. Thus, the control device may not be easily carried even in this case. As a result, sometimes, the user has difficulty in performing each operation of the multiple first operation items at a desired position when using the charged particle beam irradiation apparatus.

Accordingly, the present invention has been made keeping in mind the above problems occurring in the related art, and an object of the present invention is to provide a portable information terminal, a beam irradiation system, and a program where operation of a first operation item may be performed at a desired position.

According to an aspect of the present invention, there is provided a portable information terminal separate from a charged particle beam irradiation apparatus performing processing of a sample by irradiating the sample with a charged particle beam, the portable information terminal including: a display controller causing a display unit to display an image containing graphical user interface (GUI) capable of operating a first operation item based on operation by a user, the first operation item being a part of operation items among multiple operation items operable in the charged particle beam irradiation apparatus.

Also, according to another aspect of the present invention, in the portable information terminal, the first operation item may include an operation item related to a state of the charged particle beam.

Also, according to another aspect of the present invention, in the portable information terminal, the operation item related to the state of the charged particle beam may include at least some among acceleration voltage, a beam current, a lens mode, an aligner, a beam shift, an OL value, and a stigma value.

Also, according to another aspect of the present invention, in the portable information terminal, the first operation item may include an operation item related to detection sensitivity at which a secondary particle radiated from the sample irradiated with the charged particle beam is detected.

Also, according to another aspect of the present invention, in the portable information terminal, the operation item related to the detection sensitivity may include at least one of contrast and brightness.

Also, according to another aspect of the present invention, in the portable information terminal, there is further included an image generating part generating an observation image of the sample based on information indicating the secondary particle radiated from the sample irradiated with the charged particle beam, wherein the display controller may display the observation image formed by the image generating part at a predetermined position in the image on the display unit.

Also, according to another aspect of the present invention, in the portable information terminal, the display controller may place, in the image, the GUI at a position based on operation received from the user.

Also, according to another aspect of the present invention, in the portable information terminal, there is further included an output controller enabling an output unit to output an output of a type depending on the first operation item assigned to the GUI operated by the user, wherein different first operation items may be assigned to the GUI.

Also, according to another aspect of the present invention, in the portable information terminal, the output unit may be a speaker, and the output controller may enable the output unit to output a sound of the type as the output of the type.

Also, according to another aspect of the present invention, in the portable information terminal, the output controller may causes the output unit to output a sound of a level according to a level of operation performed by the user with respect to the GUI operated by the user.

Also, according to another aspect of the present invention, in the portable information terminal, the display unit may be a touch panel, and the output controller may not output the sound of the type from the output unit when the user does not move a touch position where the user touches while the user touches a region where the GUI is displayed on the touch panel.

Also, according to another aspect of the present invention, in the portable information terminal, the charged particle beam irradiation apparatus may be communicably connected to a control device controlling the charged particle beam irradiation apparatus, and the portable information terminal may be connected to the control device in a communicatable manner, and operates the first operation item via the control device according to operation received from the user, may.

Also, according to another aspect of the present invention, in the portable information terminal, the portable information terminal may be communicably connected to the control device wirelessly.

Also, according to another aspect of the present invention, there is provided a beam irradiation system including: a charged particle beam irradiation apparatus performing processing of a sample by irradiating the sample with a charged particle beam; and a portable information terminal separate from the charged particle beam irradiation apparatus, wherein the portable information terminal may include a display controller causing a display unit to display an image containing graphical user interface (GUI) capable of operating a first operation item based on operation by a user, the first operation item being at least a part of operation items among operation items operable in the charged particle beam irradiation apparatus.

Also, according to another aspect of the present invention, there is provided a portable information terminal separate from a beam irradiation apparatus performing processing of a sample by irradiating the sample with a beam, the portable information terminal including: a display controller causing a display unit to display an image containing graphical user interface (GUI) capable of operating a first operation item based on operation by a user, the first operation item being one or more operation items among a plurality of operation items operable in the beam irradiation apparatus.

Also, according to another aspect of the present invention, there is provided a program for causing a portable information terminal separate from a charged particle beam irradiation apparatus performing processing of a sample by irradiating the sample with a charged particle beam to execute: causing a display unit to display an image containing a graphical user interface (GUI) capable of operating a first operation item based on operation by a user, the first operation item being one or more operation items among a plurality of operation items operable in the charged particle beam irradiation apparatus.

According to the present invention, the portable information terminal, the beam irradiation system, and the program where operation of the first operation item may be performed at the desired position are provided.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Embodiment

Figure 1:
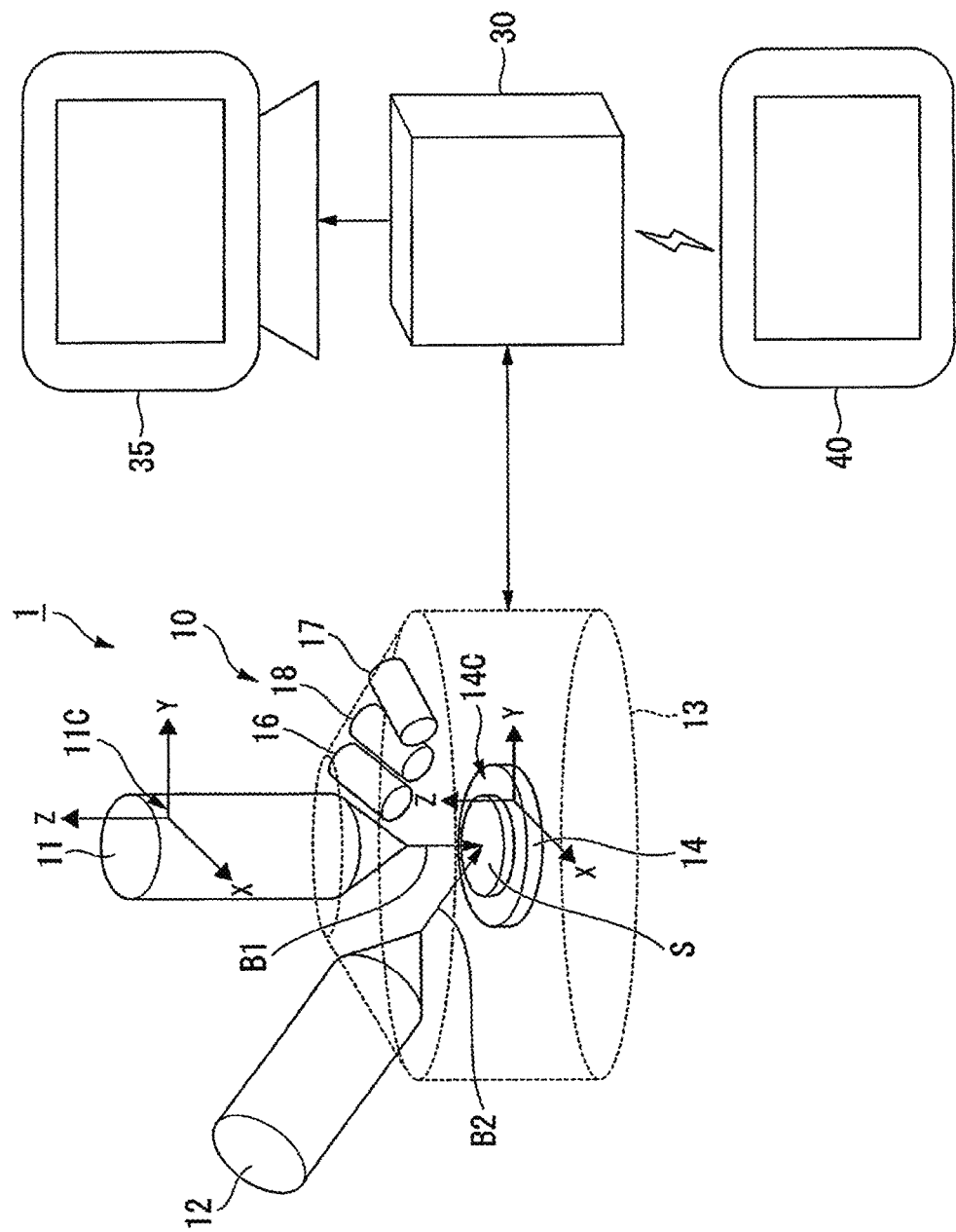
FIG. 1 is a view illustrating an example of the configuration of a beam irradiation system 1 according to an embodiment.

Hereinafter, an embodiment of the present invention will be described with reference to the accompanying drawings.

<Outline of a Process Performed by a Beam Irradiation System>

First, a process performed by a beam irradiation system 1 according to an embodiment will be described.

The beam irradiation system 1 includes a beam irradiation apparatus 10, a control device 30, and a portable information terminal 40. The beam irradiation apparatus 10, the control device 30, and the portable information terminal 40 will be described later.

In the beam irradiation system 1, the control device 30 controls the beam irradiation apparatus 10 on the basis of the operation received from a user, and a sample is irradiated with a beam to process the sample. For example, the beam irradiation system 1 exposes a cross-section of the sample by processing with the beam, generates an observation image (a cross-sectional image) of the cross-section by the beam, and displays the generated observation image. Also, the beam irradiation system 1 may be configured to perform another process on the sample, such as cutting of the sample by emitting the beam, forming of a deposition film on the sample by emitting the beam, etc. Also, hereinafter, as an example, the case where the beam is a charged particle beam where charged particles are focused, such as an electron beam, a focused ion beam, etc., will be described. That is, the beam irradiation system 1 is, in this example, a charged beam irradiation system. Also, the beam irradiation apparatus 10 is, in this example, a charged beam irradiation apparatus. Also, the beam may be, instead of a charged particle beam, a neutral particle beam, such as an infrared beam, a visible light beam, an X-ray beam, a gamma-ray beam, etc. Also, the observation image is an image showing the internal structure of the sample, such as the chemical composition of the cross-section of the sample, the crystal structure of the cross-section of the sample, etc. For example, the observation image includes a scanning ion microscope (SIM) image, a scanning electron microscope (SEM) image, a back scattering electron (BSE) image, an energy dispersive X-ray spectrometer (EDS) image, an electron backscatter diffraction (EBSD) image, etc.

In the beam irradiation system 1, when generating the observation image of the cross-section exposed by irradiating the sample with the charged particle beam, the beam irradiation apparatus 10 irradiates the cross-section with the charged particle beam, and detects secondary particles generated from the cross-section. Next, the control device 30 generates the observation image of the cross-section based on the secondary particles detected by the beam irradiation apparatus 10. The secondary particles are scattered electrons scattered by the charged particle beam among electrons contained in the sample, and X-rays emitted from the electrons excited by the charged particle beam among electrons contained in the sample. The control device 30 generates the observation image based on the secondary particles using a conventional method or a method being developed from now on. Also, the secondary particle may be the scattered electron or the X-ray or both, or other particle.

Here, in a beam irradiation system X (e.g., the conventional beam irradiation system), which is different from the beam irradiation system 1 and does not include the portable information terminal 40, a first operation item, which is a part of multiple operations items operable in the beam irradiation apparatus 10, is operated by an operation panel or the control device 30 of the beam irradiation apparatus 10. The operation panel is a panel in which hardware, such as a dial, a button, etc. for operating each first operation item is installed. However, the operation panel may not be detached from the control device 30. Also, mostly, the control device 30 is integrated with the beam irradiation apparatus 10. Also, even if the control device 30 is provided separately from the beam irradiation apparatus 10, it may not be possible to control the beam irradiation apparatus 10 due to device failure caused by being carried, etc. Thus, in this case, the control device 30 may not be easily carried. As a result, in the beam irradiation system X, sometimes, the user has difficulty in performing each operation of one or more first operation items at a desired position.

Thus, the beam irradiation system 1 includes the portable information terminal 40 in addition to the beam irradiation apparatus 10 and the control device 30. The portable information terminal 40 is provided separately from the beam irradiation apparatus 10, and displays an image containing the graphical user interface (GUI) that may be operable on the basis of the operation of the first operation item by the user. Hereinafter, for convenience of description, the GUI is referred to as an operation object. The user may operate one or more operation objects contained in the image, and may operate the first operation items assigned to one or more operation objects, respectively. When the user operates a particular operation object among one or more operation objects, the portable information terminal 40 operates the first operation item assigned to the operation object such that a set value set in the beam irradiation apparatus 10 is changed to an operation value that is a value depending on operation performed on the operation object by the user. Thus, in the beam irradiation system 1, the user may perform operation of the first operation item at the desired position. Also, the set value is a numerical value depending on the type of the first operation item, and is, for example, a numerical value representing a physical quantity, a numerical value representing a state predetermined by the user, a numerical value representing an object, etc.

The first operation item includes, in this example, two types of operation items that are an operation item on the state of the charged particle beam and an operation item on detection sensitivity at which the secondary particle radiated from the sample irradiated with the charged particle beam is detected. Also, the first operation item may include, instead of any one of the two types of operation items or both, another operation item. Alternatively, the first operation item may include, in addition to the two types of operation items, another operation item, or may include one of the two types of operation items.

In the embodiment, a process performed by the portable information terminal 40 will be described in detail. Also, hereinafter, as an example, the case where the sample is a sample S will be described. The sample S is, for example, a conductive sample. Also, the sample S may be an insulating sample, or a semi-conductive sample (a semiconductor sample). Also, the sample may be another sample rather than the sample S, and may be, for example, living body, such as cells, bones, etc. constituting living things.

<Configuration of the Beam Irradiation System 1>

Hereinafter, with reference to FIG. 1, the configuration of the beam irradiation system 1 will be described. FIG. 1 is a view illustrating an example of the configuration of the beam irradiation system 1 according to the embodiment.

The beam irradiation system 1 includes, as described above, the beam irradiation apparatus 10, the control device 30, and the portable information terminal 40. Also, the beam irradiation system 1 further includes a display device 35. Also, in the beam irradiation system 1 of this example, the beam irradiation apparatus 10, the control device 30, and the display device 35 are separately provided. Alternatively, parts or all of the beam irradiation apparatus 10, the control device 30, and the display device 35 may be integrally provided. However, in the beam irradiation system 1, the portable information terminal 40 is separately provided from the beam irradiation apparatus 10, the control device 30, and the display device 35.

The beam irradiation apparatus 10 includes, for example, a focused ion beam (FIB) column 11, an electron beam (EB) column 12, a sample chamber 13, and an operation panel (not shown).

The focused ion beam column 11 emits, as one of the above-described charged particle beams, a focused ion beam B1 where predetermined-type ions are focused. The focused ion beam column 11 includes, for example, an ion source (e.g., an ion injector, a gas field ion source, etc.), an ion acceleration part, and an ion irradiation part. The ion source generates ions. The ion acceleration part applies an electric field in an ion acceleration direction to ions generated by the ion source, and accelerates the ions. The ion acceleration direction is a direction along the central axis of the focused ion beam column 11, and is a direction toward a beam emitting hole through which the focused ion beam B1 of the focused ion beam column 11 is emitted from the ion source of the focused ion beam column 11. The ion irradiation part includes an electrostatic lens, and applies an electric field using the electrostatic lens to the ions accelerated by the ion acceleration part, and the ions are focused. Also, the ion irradiation part irradiates a predetermined irradiation region with the focused ions as the focused ion beam B1 through the beam emitting hole. Also, the electrostatic lens may be an acceleration type or a deceleration type. Also, the ion irradiation part may include a magnetic lens, and applies a magnetic field using the magnetic lens to the ions accelerated by the ion acceleration part, and the ions are focused.

The sample chamber 13 receives the focused ion beam column 11 therein. The sample chamber 13 includes a stage 14 that is a sample plate on which the sample S is placed, and a stage driving part changing the position and posture of the stage 14 in response to a request from the control device 30. In this example, the position of the stage 14 is a position in a three-dimensional coordinate system 11C, and is indicated by the position of the origin of a three-dimensional coordinate system 14C. Also, the posture of the stage 14 is a direction for each coordinate axis of the three-dimensional coordinate system 11C, and is indicated by a direction of each coordinate axis of the three-dimensional coordinate system 14C. The three-dimensional coordinate system 11C is a three-dimensional coordinate system corresponding to a predetermined position of the focused ion beam column 11. The predetermined position is, for example, the position of the centroid of the focused ion beam column 11. In FIG. 1, to prevent the figure from being complicated, the position of the origin of the three-dimensional coordinate system 11C deviates from the position of the centroid. Also, the predetermined position may be another position corresponding to the focused ion beam column 11 instead. The focused ion beam column 11 is fixed in the sample chamber 13 and does not move, and thus the position of the origin of the three-dimensional coordinate system 11C and the direction of each coordinate axis of the three-dimensional coordinate system 11C are fixed and do not move. The three-dimensional coordinate system 14C is a three-dimensional coordinate system corresponding to the center of the top surface of the stage 14. Thus, when the stage 14 is moved, the three-dimensional coordinate system 14C is moved with the stage 14. In FIG. 1, to prevent the figure from being complicated, the position of the origin of the three-dimensional coordinate system 14C deviates from the position of the center.

Here, in this example, a Z-axis direction in the three-dimensional coordinate system 11C coincides with the central-axis direction of the focused ion beam column 11. Also, an X-axis direction in the three-dimensional coordinate system 11C is a direction perpendicular to the Z-axis direction, and coincides with a direction from the focused ion beam column 11 to the electron beam column 12. Also, a Y-axis direction in the three-dimensional coordinate system 11C coincides with the X-axis direction and the Z-axis direction. Also, the X-axis direction, the Y-axis direction, and the Z-axis direction in the three-dimensional coordinate system 11C may respectively coincide with other directions instead.

When the position and the posture of the stage 14 coincide with a reference position and a reference posture that are a predetermined reference position and posture, the focused ion beam column 11 is provided at a position where the central axis of the focused ion beam column 11 is orthogonal to the top surface of the stage 14. Hereinafter, to simplify the description, the case where the user does not change the position and the posture of the stage 14 from the reference position and the reference posture will be described.

Here, in this example, the position and the posture of the stage 14 coincide with the reference position and the reference posture, the X-axis direction, the Y-axis direction, and the Z-axis direction in the three-dimensional coordinate system 14C coincide with the X-axis direction, the Y-axis direction, and the Z-axis direction in the three-dimensional coordinate system 11C, respectively. Also, the X-axis direction, the Y-axis direction, and the Z-axis direction in the three-dimensional coordinate system 14C may respectively coincide with other directions instead.

Also, the focused ion beam column 11 is provided at a position where the irradiation region is irradiated with the focused ion beam B1. The irradiation region is a plane region set on a plane along the top surface of the stage 14 when the position and the posture of the stage 14 coincide with the reference position and the reference posture. Hereinafter, as an example, the case where the irradiation region is a region set within the top surface of the stage 14 will be described. Also, in this case, the irradiation region may be a region set in a range including a part or all of the top surface of the stage 14. Also, the irradiation region is always fixed, and even through the stage driving part changes the position and the posture of the stage 14, the irradiation region is not moved with the top surface of the stage 14. That is, the stage driving part changes the position and the posture of the stage 14 such that the sample S placed on the top surface of the stage 14 may be relatively translated or tilted with respect to the irradiation region.

The electron beam column 12 emits an electron beam B2 where electrons are focused. The electron beam column 12 includes, for example, an electron source (e.g., an electron injector), an electron acceleration part, and an electron irradiation part. The electron source generates electrons. The electron acceleration part applies an electric field in an electron acceleration direction to electrons generated by the electron source, and accelerates the electrons. The electron acceleration direction is a direction along the central axis of the electron beam column 12, and is a direction toward a beam emitting hole through which the electron beam B2 of the electron beam column 12 is emitted from the electron source of the electron beam column 12. The electron irradiation part includes an electrostatic lens and applies an electric field using the electrostatic lens to the electrons accelerated by the electron acceleration part, whereby the electrons are focused. Also, the electron irradiation part emits the focused electrons as the electron beam B2 through the beam emitting hole. Also, the electrostatic lens may be an acceleration type or a deceleration type. Also, the electron irradiation part may include a magnetic lens and applies a magnetic field using the magnetic lens to the electrons accelerated by the electron acceleration part, whereby the electrons are focused.

Also, the electron beam column 12 includes a back-scattered electron detector (not shown) in the column. A back-scattered electron detector without a column detects, among electrons contained in the electron beam B2, back-scattered electrons reflected off the sample S as secondary electrons. The back-scattered electron detector in the column outputs a signal containing information indicating the detected secondary electrons to the control device 30. The information indicating the secondary electrons is information indicating the number of the back-scattered electrons.

The sample chamber 13 receives the focused ion beam column 11 and the electron beam column 12 therein. When the position and the posture of the stage 14 coincide with the reference position and the reference posture, the electron beam column 12 is provided at a position where the central axis of the electron beam column 12 is tilted at a predetermined angle with respect to the top surface of the stage 14. Also, the electron beam column 12 is provided at a position where the irradiation region is irradiated with the electron beam B2. Also, it is desirable that the electron beam column 12 is placed so as to enable a direction along the central axis of the electron beam column 12, which is a direction toward the beam emitting hole through which the electron beam B2 of the electron beam column 12 is emitted from the electron source of the electron beam column 12, to be orthogonal to a direction along the central axis of the focused ion beam column 11, which is a direction toward the beam emitting hole through which the focused ion beam B1 of the focused ion beam column 11 is emitted from the ion source of the focused ion beam column 11.

Also, the beam irradiation apparatus 10 further includes a secondary electron detector 16, an EDS detector 17, and an EBSD detector 18.

The secondary electron detector 16 detects secondary electrons generated from the sample S when the sample S is irradiated with the focused ion beam B1. The secondary electrons are scattered electrons scatted by the focused ion beam B1 among electrons contained in the sample S, etc. Also, the secondary electron detector 16 detects secondary electrons generated from the sample S when the sample S is irradiated with the electron beam B2. The secondary electrons are scattered electron scattered by the electron beam B2 among electrons contained in the sample S, etc. The secondary electron detector 16 outputs a signal containing information indicating the detected secondary electrons to the control device 30. The information is information indicating the number of the secondary electrons.

The EDS detector 17 detects an X-ray generated from the sample S when the sample S is irradiated with the electron beam B2. The X-ray generated from the sample S includes characteristic X-rays unique for respective substances constituting the sample S. The beam irradiation system 1 may identify the substances constituting the sample S using the characteristic X-rays. The EDS detector 17 outputs a signal containing information indicating the detected X-ray to the control device 30.

When the sample S is a crystalline material and the cross-section of the sample S is irradiated with the electron beam B2, the EBSD detector 18 detects intensity distribution (a diffraction pattern), i.e. an EBSD pattern, of the secondary electrons generated due to electron beam back-scattered diffraction occurs on the cross-section. The secondary electrons are scattered electrons scattered by the electron beam among electrons contained in the sample S, etc. An EBSD pattern that occurs on the cross-section shows the crystal structure of the cross-section (i.e., crystal system, crystal orientation, etc.). The beam irradiation system 1 may identify chemical composition of the cross-section using the EBSD pattern. The EBSD detector 18 outputs a signal containing information indicating the detected EBSD pattern to the control device 30.

Also, the beam irradiation apparatus 10 is connected to the control device 30 via a cable for communication. Thus, each of the focused ion beam column 11 (including the back-scattered electron detector in the column), the electron beam column 12, the stage 14, the secondary electron detector 16, the EDS detector 17, and the EBSD detector 18 of the beam irradiation apparatus 10 performs operation on the basis of a control signal obtained from the control device 30. Also, wired communication via a cable is performed by a standard, such as Ethernet (registered trade mark), Universal Serial Bus (USB), etc. Also, the beam irradiation apparatus 10 may be connected to the control device 30 by wireless communication performed by a communication standard, such as Wi-Fi (registered trade mark), etc.

Also, the beam irradiation apparatus 10 may not include some of the back-scattered electron detector in the column, the secondary electron detector 16, the EDS detector 17, and the EBSD detector 18. Also, the beam irradiation apparatus 10 may include other detectors instead of some or all of a group of the back-scattered electron detector in the column, the secondary electron detector 16, the EDS detector 17, and the EBSD detector 18. Also, the beam irradiation apparatus 10 may include other detectors in addition to the back-scattered electron detector in the column, the secondary electron detector 16, the EDS detector 17, and the EBSD detector 18.

The control device 30 is, for example, an information processing device, such as a desktop personal computer (PC), a workstation, etc. Also, the control device 30 may be another information processing device, such as a notebook PC, etc. The control device 30 is a device controlling the beam irradiation apparatus 10. Thus, it is desirable to avoid troubles, such as failure in the control device 30 that may occur by carrying the control device 30, etc. That is, the control device 30 is not a device that the user carries normally.

The control device 30, as described above, controls the beam irradiation apparatus 10. For example, the control device 30 controls the beam irradiation apparatus 10 to irradiate the sample S with the charged particle beam, such that a cross-section of the sample S is exposed. Also, the control device 30 controls the beam irradiation apparatus 10 to irradiate the cross-section with the charged particle beam.

As a result, the control device 30 enables the beam irradiation apparatus 10 to detect a secondary particle generated from the cross-section. The control device 30 obtains a signal containing information indicating the secondary particle detected by the beam irradiation apparatus 10 as observation image information indicating the cross-section from the beam irradiation apparatus 10. The control device 30 generates, on the basis of the obtained observation image information, an observation image of the cross-section indicated by the observation image information. Also, the control device 30 outputs the obtained observation image information to the portable information terminal 40 in response to a request from the portable information terminal 40. Also, the control device 30 may perform other processing, such as forming, by the beam irradiation apparatus 10, of a deposition film on the surface of the sample S for protection, etc., but the details of the processing will be omitted.

Also, the control device 30 may, based on operation received from the user, operate all of the multiple operation items operable in the beam irradiation apparatus 10.

The display device 35 is, for example, a display having a liquid crystal display panel, or an organic electro-luminescence (EL) display panel as the display unit. The display device 35 displays various images received from the control device 30 on the display unit.

Also, the display device 35 is connected to the control device 30 via a cable for communication. Thus, the display device 35 performs operation on the basis of the control signal received from the control device 30. Also, wired communication via a cable is performed by a standard, such as Ethernet (registered trade mark), USB, etc. Also, the display device 35 may be connected to the control device 30 by wireless communication performed by a communication standard, such as Wi-Fi (registered trade mark), etc.

The portable information terminal 40 is a portable information terminal provided separately from the beam irradiation apparatus 10, the control device 30, and the display device 35, such as a tablet PC, a multifunctional mobile phone terminal (a smart phone), a personal digital assistant (PDA), etc.

The portable information terminal 40 is connected to the control device 30 to be capable of communicating therewith by wireless communication performed by a communication standard, such as Wi-Fi (registered trade mark), etc. Thus, the portable information terminal 40 may communicate with the beam irradiation apparatus 10 over the control device 30. Also, the portable information terminal 40 may be connected to the control device 30 via a cable for communication.

The portable information terminal 40 displays, as described above, an image containing one or more operation objects. When the user operates the operation object contained in the image, the portable information terminal 40 operates the first operation item assigned to the operation object. Specifically, the portable information terminal 40 computes, in this case, an operation value based on operation performed on the operation object by the user. The portable information terminal 40 generates operation information that indicates information indicating the computed operation value and information indicating the first operation item. The portable information terminal 40 outputs the generated operation information to the beam irradiation apparatus 10 via the control device 30. The beam irradiation apparatus 10 obtained the operation information changes a set value set in the first operation item indicated by the operation information, to an operation value indicated by the operation information, whereby the first operation item is operated.

For example, in the case where the first operation item assigned to a particular operation object is a beam current, when the user operates the operation object, the portable information terminal 40 computes an operation value according to operation performed on the operation object by the user. The operation value is a current value because the first operation item is the beam current. The portable information terminal 40 generates operation information that indicates information indicating the computed current value and information indicating the beam current which is the first operation item. The portable information terminal 40 outputs the generated operation information to the beam irradiation apparatus 10 via the control device 30. The beam irradiation apparatus 10 obtained the operation information changes the current value which is the set value set in the beam current indicated by the operation information, to the current value which is the operation value indicated by operation information, whereby the beam current is operated.

Also, the portable information terminal 40 may output the generated operation information to the control device 30 instead of outputting the generated operation information to the beam irradiation apparatus 10 via the control device 30. In this case, the control device 30 controls the beam irradiation apparatus 10 on the basis of the obtained operation information, and controls the beam irradiation apparatus 10 to change the set value set in the first operation item indicated by the operation information to the operation value indicated by the operation information. Also, the portable information terminal 40 may output the generated operation information to the beam irradiation apparatus 10 without passing through the control device 30. In this case, the portable information terminal 40 is connected to the beam irradiation apparatus 10 by wireless or wired communication.

<Details of the First Operation Item>

Here, first operation item will be described in detail.

As described above, the first operation item includes, in this example, two types of operation items that are the operation item on the state of the charged particle beam and the operation item on detection sensitivity at which the secondary particle radiated from the sample irradiated with the charged particle beam is detected.

The state of the charged particle beam is a state defined by enlargement of the charged particle beam, the position irradiated with the charged particle beam, the current value of the beam current of the charged particle beam, etc.

More specifically, between two types of the charged particle beams emitted by the beam irradiation apparatus 10, the state of the focused ion beam B1 is a state based on set values respectively set in a first acceleration voltage, a first beam current, a first lens mode, a first aligner, a first beam shift, a first objective lens (OL) value, and a first stigma value in the focused ion beam column 11 of the beam irradiation apparatus 10. That is, the operation item on the state of the focused ion beam B1 includes at least some of the first acceleration voltage, the first beam current, the first lens mode, the first aligner, the first beam shift, the first OL value, and the first stigma value. Hereinafter, as an example, the case where the operation item includes all of the first acceleration voltage, the first beam current, the first lens mode, the first aligner, the first beam shift, the first OL value, and the first stigma value will be described.

Here, the set value set in the first acceleration voltage is a numerical value representing the voltage value of the first acceleration voltage. The set value set in the first beam current is a numerical value representing the current value of the first beam current. The set value set in the first lens mode is a numerical value representing a voltage value applied between electrodes of the electrostatic lens of the focused ion beam column 11. The set value set in the first aligner is a numerical value representing a voltage value applied between aligner electrodes of the focused ion beam column 11. The set value set in the first beam shift is a numerical value representing the shift amount of the focused ion beam B1 emitted from the focused ion beam column 11. The set value set in the first OL value is a numerical value representing the position of the objective lens (OL) (not shown) of the focused ion beam column 11. The set value set in the first stigma value is a numerical value representing a voltage value applied between stigma correction electrodes of the focused ion beam column 11.

Also, between the two types of the charged particle beams emitted by the beam irradiation apparatus 10, the state of the electron beam B2 is a state based on set values respectively set in a second acceleration voltage, a second beam current, a second lens mode, a second aligner, a second beam shift, a second OL value, a second stigma value in the electron beam column 12 of the beam irradiation apparatus 10. That is, the operation item on the state of the electron beam B2 includes at least some of the second acceleration voltage, the second beam current, the second lens mode, the second aligner, the second beam shift, the second OL value, and the second stigma value. Hereinafter, as an example, the case where the operation item includes all of the second acceleration voltage, the second beam current, the second lens mode, the second aligner, the second beam shift, the second OL value, and the second stigma value will be described.

Also, the set value set in the second acceleration voltage is a numerical value representing a voltage value of the second acceleration voltage. The set value set in the second beam current is a numerical value representing a current value of the second beam current. The set value set in the second lens mode is a numerical value representing a voltage value applied between electrodes of the electrostatic lens of the electron beam column 12. The set value set in the second aligner is a numerical value representing a voltage value applied between electrodes of the aligner of the electron beam column 12. The set value set in the second beam shift is a numerical value representing the shift amount of the electron beam B2 emitted from the electron beam column 12. The set value set in the second OL value is a numerical value representing the position of the objective lens (OL) (not shown) of the electron beam column 12. The set value set in the second stigma value is a numerical value representing a voltage value applied between stigma correction electrodes of the electron beam column 12.

The detection sensitivity at which the secondary particle radiated from the sample irradiated with the charged particle beam is detected is determined on the basis of set values respectively set in contrast and brightness in the beam irradiation apparatus 10.

More specifically, in the detection sensitivity at which the secondary particle radiated from the sample irradiated with the charged particle beam is detected, detection sensitivity at which the secondary particle is detected by the back-scattered electron detector in the column is detection sensitivity based on set values respectively set in a first contrast and a first brightness of the back-scattered electron detector in the column. That is, the operation item on the detection sensitivity at which the secondary particle is detected by the back-scattered electron detector in the column includes at least one of the first contrast and the first brightness. Hereinafter, as an example, the case where the operation item includes both the first contrast and the first brightness will be described.

Here, the set value set in the first contrast is a numerical value representing a contrast value set in the back-scattered electron detector in the column. The set value set in the first brightness is a numerical value representing a contrast value set in the back-scattered electron detector in the column.

Also, in the detection sensitivity at which the secondary particle radiated from the sample irradiated with the charged particle beam is detected, detection sensitivity at which the secondary particle is detected by the secondary electron detector 16 is detection sensitivity based on set values respectively set in a second contrast and a second brightness of the secondary electron detector 16. That is, the operation item on the detection sensitivity at which the secondary particle is detected by the secondary electron detector 16 includes at least one of the second contrast and the second brightness. Hereinafter, as an example, the case where the operation item includes both the second contrast and the second brightness will be described.

The set value set in the second contrast is a numerical value representing a contrast value set in the secondary electron detector 16. The set value set in the second brightness is a numerical value representing a contrast value set in the secondary electron detector 16.

Also, in the detection sensitivity at which the secondary particle radiated from the sample irradiated with the charged particle beam is detected, detection sensitivity at which the secondary particle is detected by the EDS detector 17 is detection sensitivity based on set values respectively set in a third contrast and a third brightness of the EDS detector 17. That is, the operation item on the detection sensitivity at which the secondary particle is detected by the EDS detector 17 includes at least one of the third contrast and the third brightness. Hereinafter, as an example, the case where the operation item includes both the third contrast and the third brightness will be described.

The set value set in the third contrast is a numerical value representing a contrast value set in The EDS detector 17. The set value set in the third brightness is a numerical value representing a contrast value set in the EDS detector 17.

Also, in the detection sensitivity at which the secondary particle radiated from the sample irradiated with the charged particle beam is detected, detection sensitivity at which the secondary particle is detected by the EBSD detector 18 is detection sensitivity based on set values respectively set in a fourth contrast and a fourth brightness of the EBSD detector 18. That is, the operation item on the detection sensitivity at which the secondary particle is detected by the EBSD detector 18 includes at least one of the fourth contrast and the fourth brightness. Hereinafter, as an example, the case where the operation item includes both the fourth contrast and the fourth brightness will be described.

The set value set in the fourth contrast is a numerical value representing a contrast value set in the EBSD detector 18. The set value set in the fourth brightness is a numerical value representing a contrast value set in the EBSD detector 18.

<Hardware Configuration of the Portable Information Terminal>

Figure 2:
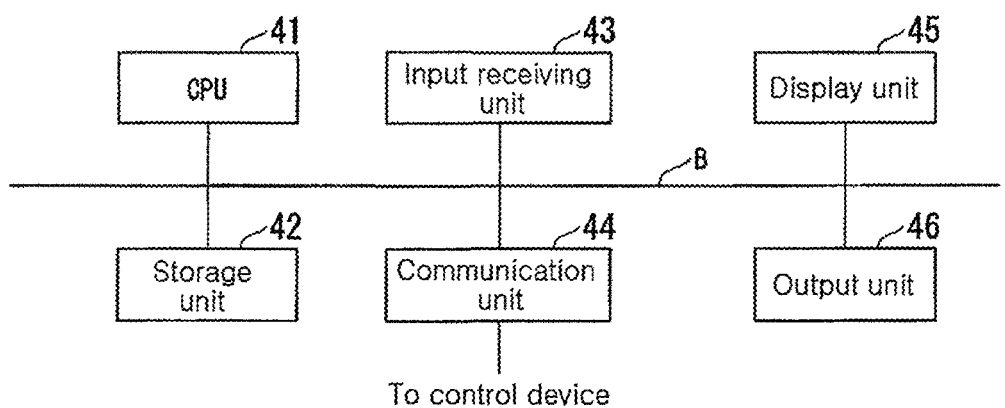
FIG. 2 is a view illustrating an example of the hardware configuration of a portable information terminal 40.

Hereinafter, referring to FIG. 2, the hardware configuration of the portable information terminal 40 will be described. FIG. 2 is a view illustrating an example of the hardware configuration of the portable information terminal 40.

The portable information terminal 40 includes, for example, a central processing unit (CPU) 41, a storage unit 42, an input receiving unit 43, a communication unit 44, a display unit 45, and an output unit 46. These components are connected to each other via a bus B for communication. Also, the portable information terminal 40 communicates with the control device 30 via the communication unit 44.

The CPU 41 executes various programs stored in the storage unit 42.

The storage unit 42 includes, for example, a hard disk drive (HDD) or a solid state drive (SSD), an electrically erasable programmable read-only memory (EEPROM), a read-only memory (ROM), a random access memory (RAM), etc. Also, the storage unit 42 may be, instead of being embedded in the portable information terminal 40, an external storage device connected thereto by a digital input/output port, such as USB, etc. The storage unit 42 stores various information and images processed by the portable information terminal 40, and various programs.

The input receiving unit 43 is, for example, a touch panel integrated with the display unit 45. Also, the input receiving unit 43 may be, instead of the touch panel, another input device, such as a keyboard, a mouse, a touch pad, etc.

The communication unit 44 includes, for example, the digital input/output port, such as USB, etc. or an Ethernet (registered trade mark) port, etc.

The display unit 45 is, for example, a liquid crystal display panel, or an organic electro luminescence (EL) display panel, and constitutes a touch panel integrally with the input receiving unit 43. Also, the display unit 45 may be separate from the input receiving unit 43.

The output unit 46 is, for example, a speaker. Also, the output unit 46 may be, instead of the speaker, a vibration device vibrating the portable information terminal 40, a light emitting diode (LED) that light blinks, etc.

<Functional Configuration of the Portable Information Terminal>

Figure 3:
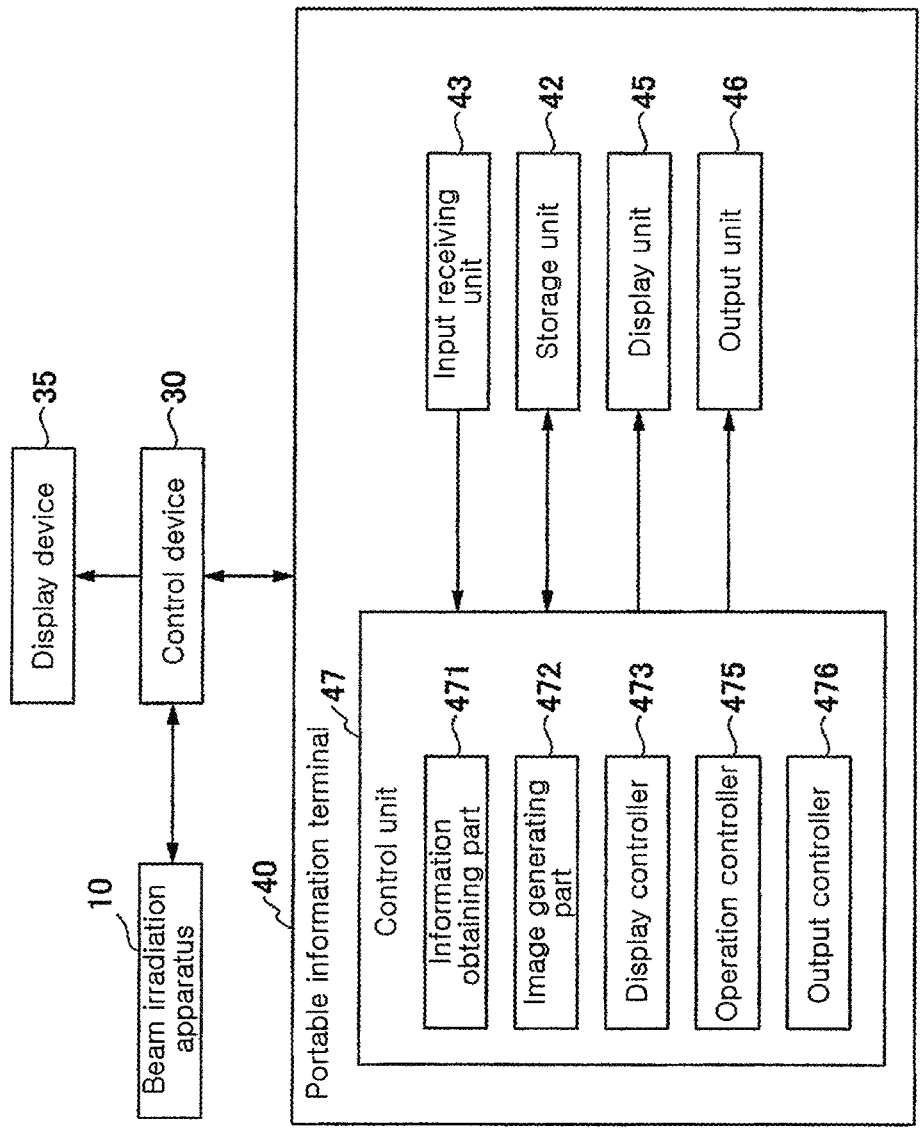
FIG. 3 is a view illustrating an example of the functional configuration of a portable information terminal 40.

Hereinafter, referring to FIG. 3, the functional configuration of the portable information terminal 40 will be described. FIG. 3 is a view illustrating an example of the functional configuration of the portable information terminal 40.

The portable information terminal 40 includes the storage unit 42, the input receiving unit 43, the display unit 45, the output unit 46, and the control unit 47.

The control unit 47 controls the portable information terminal 40 overall. The control unit 47 includes an information obtaining part 471, an image generating part 472, a display controller 473, an operation controller 475, and an output controller 476. Theses functional parts of the control unit 47 are, for example, realized by the CPU 41 executing various programs stored in the storage unit 42. Also, some or all of the functional parts may be hardware functional parts, such as large scale integration (LSI) an application-specific integrated circuit (ASIC), etc.

The information obtaining part 471 obtains set value information indicating a set value currently set in each of one or more first operation items in the beam irradiation apparatus 10, from the beam irradiation apparatus 10 through the control device 30.

The image generating part 472 obtains, from the control device 30, the observation image information obtained by the control device 30 from the beam irradiation apparatus 10, and generates an observation image based on the obtained observation image information.

The display controller 473 generates various images based on operation received from the user. The display controller 473 displays the generated images on the display unit 45. For example, the display controller 473 generates an image containing the one or more operation objects as an operation screen image based on operation received from the user. Here, the display controller 473 generates the operation screen image based on the set value information obtained by the information obtaining part 471. The display controller 473 displays the generated operation screen image on the display unit 45.

When the user operates a particular operation object in the operation screen image displayed on the display unit 45 by the display controller 473, the operation controller 475 computes the operation value according to operation performed on the operation object by the user. The operation controller 475 generates operation information that indicates information indicating the computed operation value and information indicating the first operation item. The operation controller 475 outputs the generated operation information to the beam irradiation apparatus 10 via the control device 30.

When the user operates a particular operation object in the operation screen image displayed on the display unit 45 by the display controller 473, the output controller 476 outputs to the output unit 46, based on the operation value computed by the operation controller 475 according to operation performed on the operation object by the user, an output of the type depending on the first operation item to which the operation object is assigned. The output is, in this example, sound. Also, when the output unit 46 is another device, such as a vibration device, etc., the output is an output depending on the device (when the device is the vibration device, the output is vibration). Also, the output of the type depending on each first operation item to which each operation object is assigned may be repeated or may not be repeated.

<Forming of the Operation Screen Image by the Portable Information Terminal>

In the portable information terminal 40, the user may select one or more first operation items that the user desires from one or more first operation items. Also, in the portable information terminal 40, the user may select, from one or more predetermined types, types of operation objects to which first operation items selected by the user are assigned respectively (i.e. types of GUIs, such as a dial, a slide bar, a button, etc.). Also, in the portable information terminal 40, the user may place the operation objects to which first operation items selected by the user are assigned respectively, at placement positions, the user desires, which are positions in the operation screen image.

Figure 4:
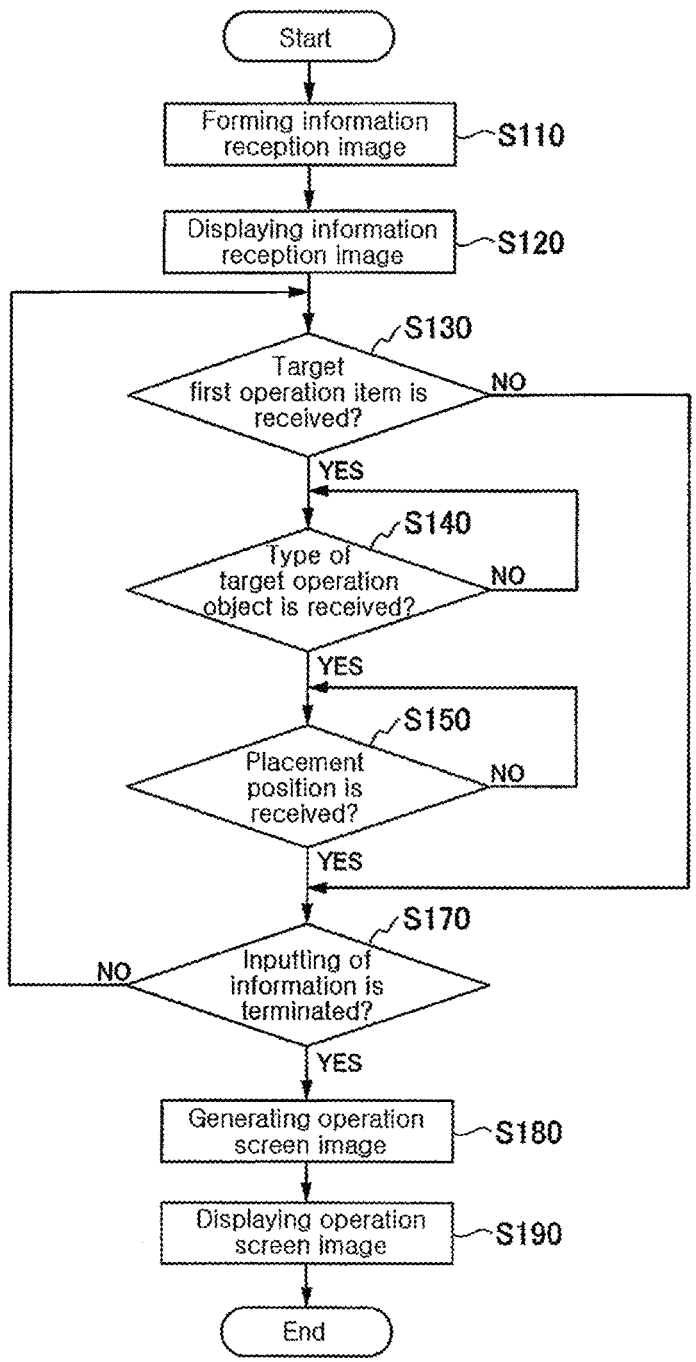
FIG. 4 is a flowchart illustrating an example of processing in which a portable information terminal 40 forms an operation screen image.

Hereinafter, referring to FIG. 4, processing in which the portable information terminal 40 forms an operation screen image will be described. FIG. 4 is a flowchart illustrating an example of processing in which the portable information terminal 40 forms an operation screen image. Processing shown in the flowchart of FIG. 4 is processing after the portable information terminal 40 receives operation for stating forming of the operation screen image from the user.

The display controller 473 generates an information reception image at step S110. The information reception image is an image containing GUI that receives various pieces of information required to generate the operation screen image from the user. The various pieces of information include, for example: one or more first operation items selected by the user; the types of the operation objects to which the first operation items indicated by the information are assigned; and placement positions which are position in the operation screen image at which the operation objects are placed. Also, the various pieces of information may include, instead of some or all of the three pieces of information, another piece of information, or may include the information in addition to the three pieces of information.

The display controller 473 displays the information reception image generated at step S110 on the display unit 45 at step S120.

Next, the display controller 473 determines whether a target first operation item is received at step S130. The target first operation item is a first operation item selected by the user from one or more unselected first operation items that may be selectable by the user. For example, the display controller 473 displays a list of information indicating one or more unselected first operation items, on the information reception image. When the user performs operation of selecting information (e.g., tap of the information) indicating a desired first operation item from the list, the display controller 473 receives the first operation item indicated by the information as the target first operation item.

When determining that the target first operation item is not received at step S130—NO, the display controller 473 proceeds to step S170. Processing at step S170 will be described later. In the meantime, when determining that the target first operation item is received at step S130—YES, the display controller 473 waits to receive the type of the target operation object at step S140. The target operation object is an operation object to which the target first operation item is assigned. The type includes, for example, a dial, a slide bar, a button, etc. Also, the type may include, instead of some or all of the dial, the slide bar, and the button, another GUI type, or may include, another GUI type in addition to the dial, the slide bar, and the button. For example, the display controller 473 displays a list of information indicating one or more GUI types that the user may select, on the information reception image. When the user performs operation of selecting information (e.g., tap of the information) indicating a desired GUI type from the list, the display controller 473 receives the type indicated by the information as the type of the target operation object.

When the target operation object is received at step S140—YES, the display controller 473 waits to receive target placement position at step S150. The target placement position is a placement position at which the target operation object is placed in the operation screen image. For example, the display controller 473 displays, on the information reception image, a reduced image with the same aspect ratio as the operation screen image and smaller than the operation screen image. Here, the coordinates on the operation screen image correspond to the coordinates on the reduced image. Thus, when the reduced image is enlarged to be the same as the operation screen image in size and the enlarged reduced image is superimposed with the operation screen image, a particular position on the operation screen image is superimposed with a position on the reduced image corresponding to the particular position. When the user performs operation of selecting a particular position on the reduced image (e.g., tap of the position), the display controller 473 receives the position on the operation screen image corresponding to the particular position as the target placement position. Also, when a region where the operation object cannot be placed is predetermined within the operation screen image, the display controller 473 relatively changes, for example, the display state of a region on the reduced image corresponding to the relevant region into the display state of a region other than the region on the reduced image, whereby the user is notified of the region where the operation object cannot be placed within the operation screen image. Also, when the user performs operation of selecting a position in a region on the reduced image corresponding to the region where the operation object cannot be placed within the operation screen image, the display controller 473 does not, for example, receive the position on the operation screen image corresponding to the relevant position as the target placement position, and displays the information reception image superimposed with an alert notifying of that the position selected by the user is the position in the region where the operation object cannot be placed. Hereinafter, as an example, the case where within the operation screen image, only one region where the operation object cannot be placed is predetermined will be described. Also, there may be multiple regions in the operation screen image.

When the target operation object is received at step S150—YES, the display controller 473 generates, as input information, information indicating the received target first operation item at step S130, information indicating the type of the received target operation object at step S140, and information indicating the received target placement position at step S150. The display controller 473 stores the generated input information in the storage unit 42. Next, the display controller 473 proceeds to step S170.

At step S170, the display controller 473 determines whether operation of terminating input by the user of various pieces of information required to form the operation screen image via the information reception image is received at step S170. For example, the information reception image contains a button receiving operation. When the user performs operation of selecting the button (e.g., tap of the button), the display controller 473 determines that operation of terminating input by the user of various pieces of information required to generate the operation screen image via the information reception image is received, and deletes display of the information reception image from the display unit 45. When determining that operation of terminating input by the user of various pieces of information required to generate the operation screen image via the information reception image is not received at step S170—NO, the display controller 473 proceeds to step S130, and determines whether the target first operation item is received again. In the meantime, when determining that operation of terminating input by the user of various pieces of information required to generate the operation screen image via the information reception image is received at step S170—YES, the display controller 473 generates the operation screen image at step S180 based on one or more pieces of input information stored in the storage unit 42. Here, processing at step S180 will be described.

At step S180, the display controller 473 reads one or more pieces of information stored in the storage unit 42. Also, the display controller 473 generates an image as the operation screen image where nothing is placed. The display controller 473 assigns, for each of one or more pieces of read input information, the first operation item indicated by the input information to the operation object of the type indicated by the input information, and place the operation object to which the first operation item is assigned at the placement position in the generated image indicated by the input information. Thus, the display controller 473 generates the operation screen image. As described above, in the portable information terminal 40, the user may select one or more first operation items that the user desires from one or more first operation items. Also, in the portable information terminal 40, the user may select, from one or more predetermined types, the types of operation objects to which the first operation items selected by the user are assigned respectively. Also, in the portable information terminal 40, the user may place the operation object to which the first operation item selected by the user is assigned at the placement position which is the position in the operation screen image and is desired by the user.

Figure 5:
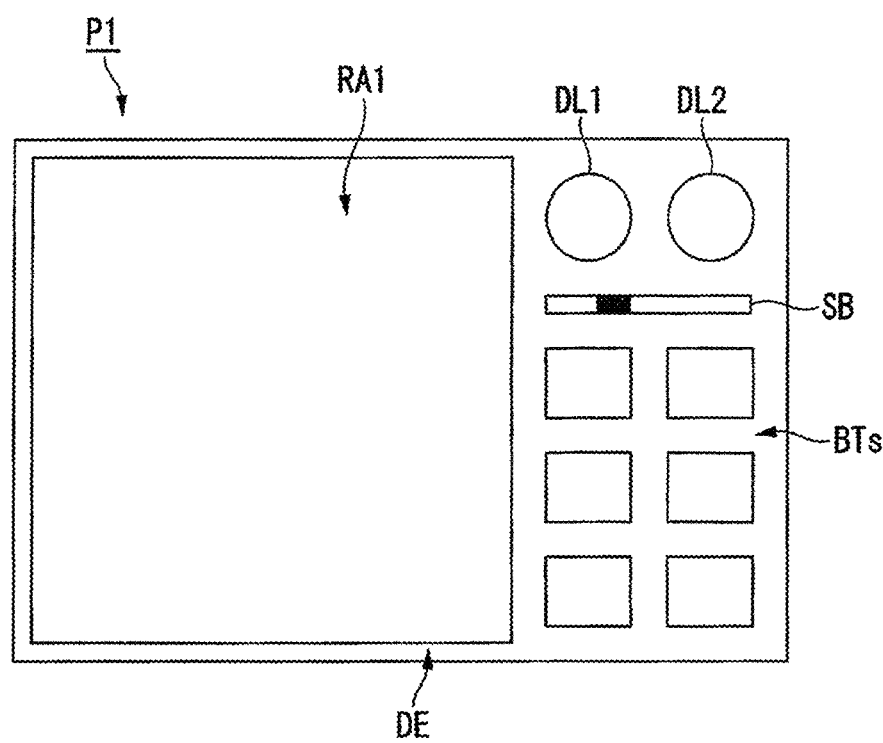
FIG. 5 is a view illustrating an example of an operation screen image formed at step S180.

Hereinafter, referring to FIGS. 5 and 6, more specific processing at steps S180 and S190 and specific operation of the operation object in the operation screen image will be described. FIG. 5 is a view illustrating an example of the operation screen image generated at step S180. Also, here, for convenience of description, the case where, in process of repeatedly executed step S130, the display controller 473 receives, the first contrast, the first brightness, the second OL value, the second lens mode, the second acceleration voltage, the second beam current, the second aligner, the second beam shift, the second stigma value as target first operation items, among one or more first operation items will be described. An image P1 in FIG. 5 is, in this case, an example of the operation screen image generated by the display controller 473.

The image P1 contains a dial DL1, a dial DL2, a slide bar SB, and six buttons BTs as operation objects.

The dial DL1 is the operation object to which the first contrast received by the display controller 473 as the target first operation item is assigned. The dial DL1 has, for example, a display column (not shown) displaying a set value currently set in the first contrast assigned to the dial DL1. When the display controller 473 generates the operation screen image, the information obtaining part 471 obtains set value information indicating the set value from the beam irradiation apparatus 10 via the control device 30. The display controller 473 forms, on the basis of the set value indicated by the set value information obtained by the information obtaining part 471, the dial DL1 having the display column displaying the set value. Also, while the display controller 473 displays the operation screen image on the display unit 45, whenever the dial DL1 is operated, the information obtaining part 471 obtains set value information indicating the set value from the beam irradiation apparatus 10 via the control device 30. Whenever the information obtaining part 471 obtains the set value information, the display controller 473 displays the set value indicated by the obtained set value information on the display column. Also, instead of the display column, the dial DL1 may have the gradations spaced out at predetermined intervals along the circumference of the dial DL1 and a numerical value for each gradation.

When the dial DL1 is operated by the user, the operation controller 475 computes an operation value in accordance with operation performed on the dial DL1 by the user. For example, the operation controller 475 computes, as the operation value, a value obtained by multiplying a predetermined value corresponding to the unit rotation angle of the dial DL1 and a rotation angle when the user rotates the dial DL1. The unit rotation angle is, for example, 0.1 degrees. Also, the unit rotation angle may be a rotation angle smaller than 0.1 degrees, or may be a rotation angle larger than 0.1 degrees. The predetermined value is the smallest value that is changeable when changing the first contrast value set for the first contrast. Also, instead of this, the predetermined value may be another value changeable when changing the first contrast value set for the first contrast. Here, the operation controller 475 computes, in this example, the operation value as a positive value when the dial DL1 is rotated in a clockwise direction, and computes the operation value as a negative value when the dial DL1 is rotated in a counter clockwise direction. Also, when the dial DL1 is rotated in a counter clockwise direction, the operation controller 475 computes the operation value as a positive value, and when the dial DL1 is rotated in a clockwise direction, the operation controller 475 computes the operation value as a negative value. The operation controller 475 generates operation information that indicates information indicating the computed operation value and information indicating the first operation item (i.e., the first contrast) assigned to the dial DL1. The operation controller 475 outputs the generated operation information to the beam irradiation apparatus 10 via the control device 30. Thus, the portable information terminal 40 may, in this case, operate the first contrast in accordance with operation performed on the dial DL1 by the user. Also, when the user does not rotate the dial DL1 while touching the dial DL1, the operation controller 475 may not compute the operation value. The case where the user does not rotate the dial DL1 while touching the dial DL1 is a case where the user touches a region on which the dial DL1 is displayed on the touch panel, and also a case where the user does not move the touch position that the user touches.

Also, when the dial DL1 is operated by the user, the output controller 476 outputs to the output unit 46, a sound of the type depending on the first contrast (in this example, the first operation item assigned to the dial DL1) assigned to the dial DL1. The type (the type of the sound) depending on the first contrast, namely, the type (the type of the sound) depending on the first operation item may be selectable by the user, or may be predetermined. When the type is selectable by the user, the output controller 476 receives, for example, the type from the user via the information reception image at step S130. Also, when the dial DL1 is operated by the user, the output controller 476 outputs to the output unit 46 a sound of the level depending on the operation value (the operation value of the dial DL1) computed by the operation controller 475. The level is, for example, the length. Also, the level may be, instead of the length, the height of the sound, etc. That is, the operation value is a value indicating the level of operation performed on the dial DL1 by the user. Also, when the user does not rotate the dial DL1 while touching the dial DL1, the output controller 476 does not output the sound from the output unit 46.

The dial DL2 is the operation object to which the first brightness received by the display controller 473 as the target first operation item is assigned. Operation of the display controller 473, the operation controller 475, and the output controller 476 related to the dial DL2 is the same as operation of the display controller 473, the operation controller 475, and the output controller 476 in the case where the dial DL1 is operated by the user, and thus description thereof will be omitted.

The slide bar SB is the operation object to which the second OL value received by the display controller 473 as the target first operation item is assigned. The slide bar SB has, for example, a display column (not shown) displaying a set value currently set in the second OL value assigned to the slide bar SB. When the display controller 473 generates the operation screen image, the information obtaining part 471 obtains set value information indicating the set value from the beam irradiation apparatus 10 via the control device 30. The display controller 473 forms, on the basis of the set value indicated by the set value information obtained by the information obtaining part 471, the slide bar SB having the display column displaying the set value. Also, while the display controller 473 displays the operation screen image on the display unit 45, whenever the slide bar SB is operated, the information obtaining part 471 obtains set value information indicating the set value from the beam irradiation apparatus 10 via the control device 30. Whenever the information obtaining part 471 obtains the set value information, the display controller 473 displays the set value indicated by the obtained set value information on the display column. Also, instead of the display column, the slide bar SB may have the gradations spaced out at predetermined intervals along the slide bar SB and a numerical value for each gradation.

When the slide bar SB is operated by the user, the operation controller 475 computes the operation value in accordance with operation performed on the slide bar SB by the user. For example, the operation controller 475 computes, as the operation value, a value obtained by multiplying a predetermined value corresponding to the unit slide width of the slide bar SB and a slide width when the user slides the slide bar SB. The unit slide width is the minimum slide width that is slidable when sliding the slide bar SB, for example, 1 mm. Also, the unit slide width may be a slide with smaller than 1 mm, or may be a slide with larger than 1 mm. The predetermined value is the smallest value that is changeable when changing the set value set for the second OL value. Also, the predetermined value may be another value changeable when changing the set value for the second OL value. Here, the operation controller 475 computes, in this example, the operation value as a positive value when the slide bar SB is slid in a first direction of two directions in which the slide bar SB is slidable, and computes the operation value as a negative value when the slide bar SB is slid in a second direction opposite to the first direction. Also, the operation controller 475 may compute the operation value as a positive value when the slide bar SB is slid in the second direction, and may compute the operation value as a negative value when the slide bar SB is slid in the first direction. In the operation screen image, the first direction and the second direction may be arbitrarily changed by the user, or may be predetermined. In the case where the user is able to arbitrarily change the directions of the first direction and the second direction in the operation screen image, when the display controller 473 receives, for example, the slide bar as the type of the target operation object at step S140, the direction is received from the user via the information reception image. The operation controller 475 generates operation information that indicates information indicating the computed operation value and information indicating the first operation item (i.e., the second OL value) assigned to the slide bar SB. The operation controller 475 outputs the generated operation information to the beam irradiation apparatus 10 via the control device 30. Thus, the portable information terminal 40 may, in this case, operate the second OL value in accordance with operation performed on the slide bar SB by the user. Also, when the user does not slide the slide bar SB while touching the slide bar SB, the operation controller 475 may not compute the operation value. The case where the user does not slide the slide bar SB while touching the slide bar SB is a case where the user touches a region on which the slide bar SB is displayed on the touch panel, and also a case where the user does not move the touch position that the user touches.

Also, when the slide bar SB is operated by the user, the output controller 476 outputs to the output unit 46 a sound of the type depending on the second OL value (in this example, the first operation item assigned to the slide bar SB) assigned to the slide bar SB. The type (of the sound) depending on the second OL value, namely, the type (of the sound) depending on the first operation item may be, like the cases of the dial DL1 and the dial DL2, selected by the user, or may be predetermined. Also, when the slide bar SB is operated by the user, the output controller 476 outputs, like the cases of the dial DL1 and the dial DL2, to the output unit 46 a sound of the level depending on the operation value (of the slide bar SB) computed by the operation controller 475.

Each of the six buttons BTs is the operation object to which the second lens mode received by the display controller 473 as the target first operation item is assigned. A set value set in the second lens mode is, in this example, one of values indicating six lens modes. That is, each of the buttons BTs corresponds to one of the six lens modes without repetition. That is, the user may select, by operation of selecting a button from buttons BTs (e.g., tap of the button), the value corresponding to the button as the operation value set in the second lens mode, such that the second lens mode is operated. When the display controller 473 generates the operation screen image, the information obtaining part 471 obtains set value information indicating the set value currently set in the second lens mode from the beam irradiation apparatus 10 via the control device 30. The display controller 473 changes the display state of the button corresponding to the set value indicated by the set vale information obtained by the information obtaining part 471, among buttons included in the buttons BTs. The display state is, for example, the color, the brightness, and the size of the button, etc. Also, while the display controller 473 displays the operation screen image on the display unit 45, whenever one button included in the buttons BTs is operated (tapped), the information obtaining part 471 obtains the set value information indicating the set value from the beam irradiation apparatus 10 via the control device 30. Whenever the information obtaining part 471 obtains the set value information, the display controller 473 changes the display state of the button corresponding to the set value indicated by the set value information obtained by the information obtaining part 471, among buttons included in the buttons BTs. Also, the number of buttons included in the buttons BTs may be, instead of six, smaller than six, or larger than six.

When a button of six buttons included in the buttons BTs is operated by the user, the operation controller 475 specifies the operation value corresponding to the button. The operation controller 475 generates operation information that indicates information indicating a specific operation value and information indicating first operation items (i.e., the second lens mode) assigned to the buttons BTs. The operation controller 475 outputs the generated operation information to the beam irradiation apparatus 10 via the control device 30. Thus, the portable information terminal 40 may, in this case, operate the second lens mode in accordance with operation performed on the buttons BTs by the user. Also, when the user touches a button included in the buttons BTs and does not take the hand off the button, the operation controller 475 does not compute the operation value.

Also, when a button of six buttons included in the buttons BTs is operated by the user, the output controller 476 outputs to the output unit 46, a sound of the type depending on the button, among sound of six types depending on the second lens modes assigned to the buttons BTs (in this example, first operation items assigned to the buttons BTs). The type (of the sound) depending on the button may be selectable by the user, or may be predetermined. When the type is selectable by the user, the output controller 476 receives, for example, the type from the user via the information reception image at step S140. Also, when the button is operated by the user, the output controller 476 outputs to the output unit 46, a sound of the level depending on the operation value (of the button) computed by the operation controller 475. Also, when the user touches a button included in the buttons BTs and does not take the hand off the button, the output controller 476 does not output a sound from the output unit 46.

Also, the image P1 contains an end portion DE and a region RA1.

The end portion DE is one of end portions along four sides of the image P1 in a rectangular shape. In the example shown in FIG. 5, the end portion DE is an end portion on the direction side from the dial DL1 and the dial DL2 toward the slide bar SB. When the user performs slide operation from the end portion DE inwardly in the image P1, the display controller 473 displays the region RA2 shown in FIG. 6 superimposed on another image or GUI. FIG. 6 is a view illustrating an example of the image P1 where the region RA2 is displayed. Also, when the user performs slide operation toward the end portion DE within the region RA2, the display controller 473 deletes display of the region RA2 from the display unit 45.

Figure 6:
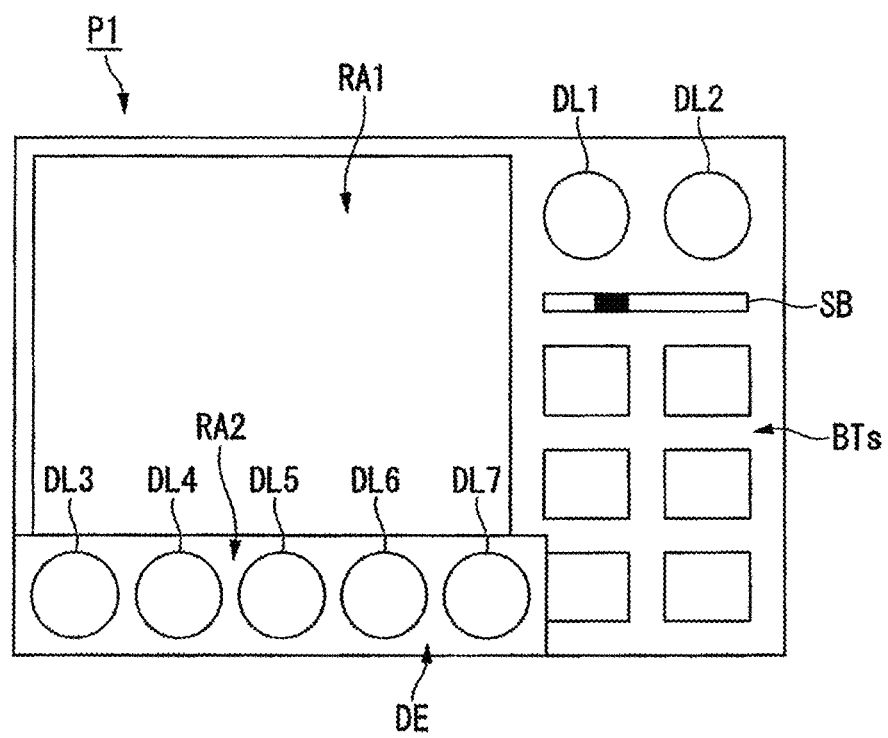
FIG. 6 is a view illustrating an example of a image P1 where a region RA2 is displayed.

In the example shown in FIG. 6, the region RA2 contains five dials that are dial DL3 to dial DL7 as operation objects. Also, the region RA2 may contain, instead of some or all of the five dials, another type of an operation object, or may contain, instead of some or all of the five dials, another GUI. Alternatively, in addition to the five dials, the region RA2 may contain another type of an operation object, or in addition to the five dials, may contain another GM.

As described above, the display controller 473 may switch display/non-display of the region RA2 in the image P1 by slide operation of the user. Thus, the portable information terminal 40 may increase information displayable on the image P1.

The dial DL3 is the operation object to which the second acceleration voltage received by the display controller 473 as the target first operation item is assigned. Operation of the display controller 473, the operation controller 475, and the output controller 476 related to the dial DL3 is the same as operation of the display controller 473, the operation controller 475, and the output controller 476 in the case where the dial DL1 is operated by the user, and thus description thereof will be omitted.

The dial DL4 is the operation object to which the second beam current received by the display controller 473 as the target first operation item is assigned. Operation of the display controller 473, the operation controller 475, and the output controller 476 related to the dial DL4 is the same as operation of the display controller 473, the operation controller 475, and the output controller 476 in the case where the dial DL1 is operated by the user, and thus description thereof will be omitted.

The dial DL5 is the operation object to which the second aligner received by the display controller 473 as the target first operation item is assigned. Operation of the display controller 473, the operation controller 475, and the output controller 476 related to the dial DL5 is the same as operation of the display controller 473, the operation controller 475, and the output controller 476 in the case where the dial DL1 is operated by the user, and thus description thereof will be omitted.

The dial DL6 is the operation object to which the second beam shift received by the display controller 473 as the target first operation item is assigned. Operation of the display controller 473, the operation controller 475, and the output controller 476 related to the dial DL6 is the same as operation of the display controller 473, the operation controller 475, and the output controller 476 in the case where the dial DL1 is operated by the user, and thus description thereof will be omitted.

The dial DL7 is the operation object to which the second stigma value received by the display controller 473 as the target first operation item is assigned. Operation of the display controller 473, the operation controller 475, and the output controller 476 related to the dial DL7 is the same as operation of the display controller 473, the operation controller 475, and the output controller 476 in the case where the dial DL1 is operated by the user, and thus description thereof will be omitted.

Referring back to FIG. 5, the region RA1 is a region where the operation object cannot be placed within the operation screen image, and a region where the observation image generated by the control device 30 is displayed. That is, the position of the region RA1 in the operation screen image is predetermined. Also, the position of the region RA1 in the operation screen image may be changeable by the user. When the image P1 is displayed on the display unit 45, the image generating part 472 obtains, from the control device 30, the observation image information obtained by the control device 30 from the beam irradiation apparatus 10, and generates an observation image based on the obtained observation image information. Also, the display controller 473 displays the observation image generated by the image generating part 472 on the region RA1. Also, when the region RA2 is displayed, the display controller 473 may change the shape of the region RA1 depending on the region where the region RA2 is displayed in the operation screen image. Thus, the portable information terminal 40 may prevent the region RA1 from being partially hidden by the region RA2.

Also, the display controller 473 may, in accordance with operation received from the user, change the position of the region RA1 to a position depending on the user. For example, the display controller 473 receives information indicating that the user is left-handed or right-handed, and changes the position of the region RA1 on the basis of the received information. For example, when displacement of the region RA1 in the image P1 shown in FIG. 5 is for right-handed use, the display controller 473 reverses a relative left and right positional relation between the region RA1 and another operation object on the image P1 in FIG. 5.

Figure 7:
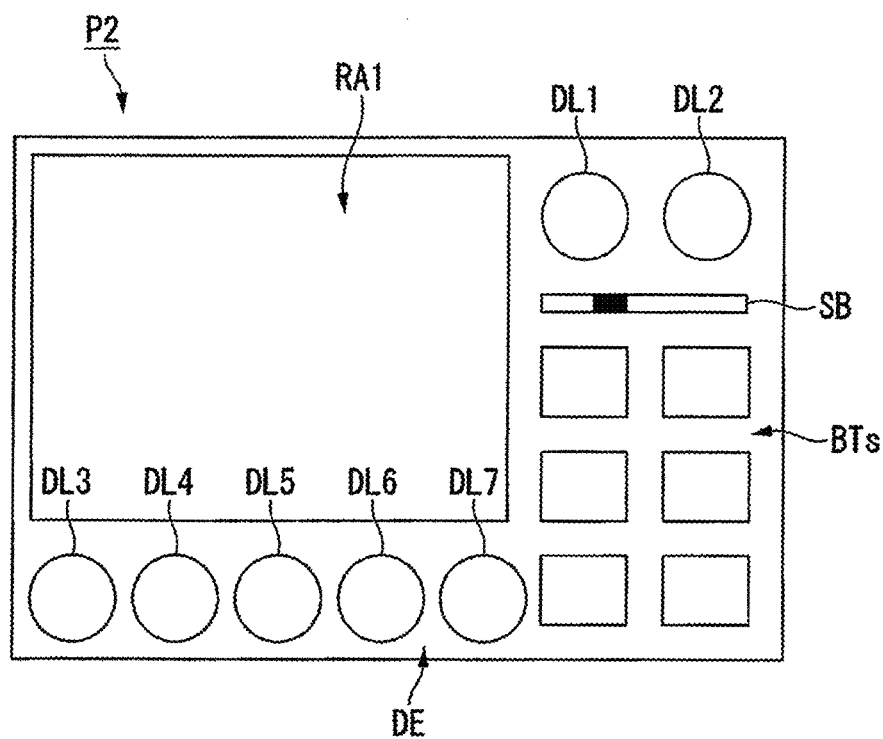
FIG. 7 is a view illustrating another example of the operation screen image formed at step S180.

Also, as shown in FIG. 7, the display controller 473 may form, based on one or more pieces of input information received from the user, an operation screen image where the dial DL1 to dial DL7, the slide bar SB, the buttons BTs, the region RA1 are able to be displayed all without displaying the region RA2. The image P2 shown in FIG. 7 is the example of the operation screen image. That is, FIG. 7 is a view illustrating another example of the operation screen image generated at step S180.

Referring back to FIG. 4, after performing processing of step S180, the display controller 473 displays the operation screen image generated at step S180 on the display unit 45 at step S190, and terminate processing.

Modification of the Embodiment

The above-described portable information terminal 40 may store history information indicating the history of the operation screen image displayed on the display unit 45. For example, the display controller 473 may store the information indicating the operation screen image generated at step S180 in FIG. 4, in the storage unit 42 as the history information. In this case, the display controller 473 displays, in accordance with operation received from the user, the operation screen image indicated by the history information selected by the user from one or more pieces of history information stored in the storage unit 42, on the display unit 45. Thus, the portable information terminal 40 may, based on the history information, display an appropriate operation screen image in accordance with operation performed by the user on the display unit 45.

Also, in the above-described portable information terminal 40, information indicating the operation screen image displayed on the display unit 45 may stored in the storage unit 42 in advance. In this case, without receiving various pieces of information from the user via the information reception image, the portable information terminal 40 reads the information indicating the operation screen image from the storage unit 42 in accordance with operation received from the user, and display the operation screen image indicated by the read information on the display unit 45. Thus, the portable information terminal 40 may enable the user to use an operation screen image recommend by a maker that produced the portable information terminal 40.

Also, function of the above-described portable information terminal 40 may be obtained as an application program from a server connected to a network, such as the Internet, a mobile communication network, etc. In this case, a portable information terminal, such as a tablet PC, a multifunctional mobile phone terminal (a smart phone), etc., downloads the application program from the server via the network, and installs the downloaded application program, thereby having the same function as the portable information terminal 40. Thus, the user may use a portable information terminal that the user desires as the portable information terminal 40.

Also, the control device 30 may be connected to multiple portable information terminals 40 in a communicatable manner. In this case, when a first portable information terminal, which is a particular the portable information terminal 40 of the multiple the portable information terminals 40, is operating the first operation item of the beam irradiation apparatus 10 via the control device 30, another portable information terminal 40 other than the first portable information terminal of the multiple portable information terminals 40 may not operate the first operation item. The another portable information terminal 40 may operate the first operation item after operation of the first operation item by the first portable information terminal is terminated.

As described above, the portable information terminal 40 according to the embodiment is a portable information terminal separate from a charged particle beam irradiation apparatus (in this example, the beam irradiation apparatus 10) performing processing of a sample by irradiating the sample with a charged particle beam (in this example, the focused ion beam B1 and the electron beam B2), and displays an image (in this example, the operation screen image) on a display unit (in this example, the display unit 45), the image containing GUI (in this example, the operation object) being capable of operating a first operation item, which is an operation item of operable multiple operation items in the charged particle beam irradiation apparatus, in accordance with operation by the user. Thus, in the portable information terminal 40, operation of the first operation item may be performed at a desired position.

Also, in the portable information terminal 40, the first operation item includes an operation item related to the charged particle beam. Thus, in the portable information terminal 40, operation of the first operation item including an operation item related to the state of the charged particle beam may be performed at a desired position.

Also, in the portable information terminal 40, the operation item related to the state of the charged particle beam may include at least some among acceleration voltage, beam current, lens mode, aligner, beam shift, OL values, and stigma values. Thus, in the portable information terminal 40, operation of the first operation item including at least some of the acceleration voltage, the beam current, the lens mode, the aligner, the beam shift, the OL value, and the stigma value may performed at the desired position.

Also, in the portable information terminal 40, the first operation item includes an operation item on detection sensitivity at which a secondary particle (in this example, an electron, an X-ray, etc.) radiated from the sample irradiated with the charged particle beam is detected. Thus, in the portable information terminal 40, operation of the first operation item including an operation item related to detection sensitivity at which the secondary particle radiated from the sample irradiated with the charged particle beam is detected may performed at the desired position.

Also, in the portable information terminal 40, the first operation item includes the operation item related to detection sensitivity at which the secondary particle (in this example, an electron, an X-ray, etc.) radiated from the sample irradiated with the charged particle beam is detected, the operation item including at least one of contrast and brightness. Thus, in the portable information terminal 40, operation of the first operation item including at least one of the contrast and the brightness may performed at the desired position.

Also, the portable information terminal 40 displays on a display unit an observation image formed by the image generating part (in this example, the image generating part 472) at a predetermined position in an image containing GUI being capable of operating the first operation item based on operation by the user. Thus, in the portable information terminal 40, operation of the first operation item may perform at the desired position while checking the observation image displayed on the display unit.

Also, the portable information terminal 40 places, in the image containing GUI being capable of operating the first operation item based on operation by the user, the GUI at a position in accordance with operation received from the user. Thus, the portable information terminal 40 may place the GUI at a position that the user desires in the image.

Also, the portable information terminal 40 outputs to an output unit, an output of the type depending on the first operation item assigned to the GUI operated by the user. Thus, in the portable information terminal 40, the user may operate the desired first operation item without viewing the display unit due to the output.

Also, the portable information terminal 40 outputs to the output unit, a sound of the type as an output of the type depending on the first operation item assigned to the GUI operated by the user. Thus, in the portable information terminal 40, the user may operate the desired first operation item without viewing the display unit due to the sound.

Also, the portable information terminal 40 outputs to the output unit, a sound of the level depending on the level of operation performed on the GUI by the user. Thus, in the portable information terminal 40, the user may operate the first operation item in accordance with the level of operation without viewing the display unit.

Also, the portable information terminal 40 does not output from the output unit, a sound of the type depending on the first operation item assigned to the GUI operated by the user, when the user touches a region where the GUI is displayed on the touch panel, and when the user does not move the touch position that the user touches. Thus, in the portable information terminal 40, the user may clearly distinguish between the case where the first operation item is operated and the case where the first operation item is not operated without viewing the display unit. As a result, the portable information terminal 40 may inhibit mal-operation of the first operation item by the user.

Although the embodiment of the present invention has been described in above, the detailed configuration is not limited to this embodiment, but may be modified, substituted, deleted, etc. without departing from the scope of the present invention.

Also, a program for realizing functions of any component in the above-described apparatus (e.g., the control device 30 and the portable information terminal 40) may be recorded in a computer-readable recording medium, and the program may be loaded into a computer system and executed. Also, "the computer system" includes hardware, such as an operating system (OS), peripheral devices, etc. Also, "the computer-readable recording medium" is a portable medium, such as a flexible disk, a magneto-optical disk, a ROM, a compact disk (CD)-ROM, etc.; and a storage device, such as a hard disk embedded in the computer system, etc. Also, "the computer-readable recording medium" includes a thing holding the program for a certain period of time, such as a volatile memory (RAM) in a computer system serving as a server or a client when the program is transmitted via a network, such as the Internet, etc., or a communication line, such as a telephone line, etc.

Also, the program may be transmitted from a computer system storing the program in a storage device, etc. to another computer system via a transmission medium or transmission waves of the transmission medium. Here, the "transmission medium" for transmitting the program is a medium having a function of transmitting information, the medium being a network (communication network), such as the Internet, etc., or a communication line, such as a telephone line, etc.

Also, the program may be for realizing a part of the functions described above. Also, the program may be a so-called difference file (difference program) that may realize the functions in combination with a program already recoded in the computer system.

What is claimed is:

1. A portable information terminal separate from a charged particle beam irradiation apparatus for performing processing of a sample by irradiating the sample with a charged particle beam, the portable information terminal comprising:
   a display controller causing a display unit to display an image containing a graphical user interface (GUI) capable of operating a first operation item based on operation by a user, the first operation item being a part of operation items among a plurality of operation items operable in the charged particle beam irradiation apparatus; and
   an output controller causing an output unit to output an output of a type according to the first operation item assigned to the GUI operated by the user, wherein different first operation items are assigned to the GUI, and the output unit is a speaker, and the output controller causes the output unit to output an audible sound of the type as the output of the type.

2. The portable information terminal of claim 1, wherein the first operation item includes an operation item related to a state of the charged particle beam.

3. The portable information terminal of claim 2, wherein the operation item related to the state of the charged particle beam includes at least some among acceleration voltage, beam current, lens modes, aligner, beam shift, OL values, and stigma values.

4. The portable information terminal of claim 1, wherein the first operation item includes an operation item related to detection sensitivity at which a secondary particle radiated from the sample irradiated with the charged particle beam is detected.

5. The portable information terminal of claim 4, wherein the operation item related to the detection sensitivity includes at least one of contrast and brightness.

6. The portable information terminal of claim 1, further comprising:
an image generating part generating an observation image of the sample based on information indicating the secondary particle radiated from the sample irradiated with the charged particle beam,
wherein the display controller causes the display unit to display the observation image generated by the image generating part at a predetermined position in the image.

7. The portable information terminal of claim 1, wherein the display controller places, in the image, the GUI at a position according to operation received from the user.

8. The portable information terminal of claim 1, wherein the output controller causes the output unit to output an audible sound of a level according to a level of operation performed by the user with respect to the GUI operated by the user.

9. The portable information terminal of claim 8, wherein the portable information terminal is communicably connected to the control device wirelessly.

10. The portable information terminal of claim 1, wherein the display unit is a touch panel; and
the output controller does not output the sound of the type from the output unit when the user does not move a touch position where the user touches while the user touches a region where the GUI is displayed on the touch panel.

11. The portable information terminal of claim 1, wherein the charged particle beam irradiation apparatus is communicably connected to a control device controlling the charged particle beam irradiation apparatus; and
the portable information terminal, is communicably connected to the control device and operates the first operation item via the control device according to operation received from the user.

12. The portable information terminal of claim 1, wherein the portable information terminal is one of a tablet PC, a smart phone or a personal digital assistant.

13. The portable information terminal of claim 1, wherein the portable information terminal is configured to be carried by hand.

14. A beam irradiation system comprising:
a charged particle beam irradiation apparatus for performing processing of a sample by irradiating the sample with a charged particle beam; and
a portable information terminal separate from the charged particle beam irradiation apparatus,
wherein the portable information terminal includes a display controller causing a display unit to display an image containing a graphical user interface (GUI) capable of operating a first operation item based on operation by a user, the first operation item being at least a part of operation items among operation items operable in the charged particle beam irradiation apparatus; and
an output controller causing an output unit to output an output of a type according to the first operation item assigned to the GUI operated by the user, wherein
different first operation items are assigned to the GUI, and
the output unit is a speaker and the output controller causes the output unit to output an audible sound of the type as the output of the type.

15. The beam irradiation system of claim 14, wherein the output controller causes the output unit to output an audible sound of a level according to a level of operation performed by the user with respect to the GUI operated by the user.

16. The beam irradiation system of claim 14, wherein the portable information terminal is one of a tablet PC, a smart phone or a personal digital assistant.

17. The beam irradiating system of claim 14, wherein the portable information terminal is configured to be carried by hand.

* * * * *